(12) United States Patent
Aratani et al.

(10) Patent No.: US 7,307,270 B2
(45) Date of Patent: Dec. 11, 2007

(54) MEMORY ELEMENT AND MEMORY DEVICE

(75) Inventors: Katsuhisa Aratani, Chiba (JP); Akira Kouchiyama, Kanagawa (JP); Tetsuya Mizuguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 106 days.

(21) Appl. No.: 11/302,781

(22) Filed: Dec. 14, 2005

(65) Prior Publication Data
US 2006/0126423 A1 Jun. 15, 2006

(30) Foreign Application Priority Data
Dec. 14, 2004 (JP) .............. P2004-361755

(51) Int. Cl.
*H01L 47/00* (2006.01)
(52) U.S. Cl. .............. 257/2; 257/3; 257/E45.003; 365/148
(58) Field of Classification Search .............. 257/2
See application file for complete search history.

(56) References Cited

U.S. PATENT DOCUMENTS 7,129,133 B1 * 10/2006 Avanzino et al. .......... 438/244

* cited by examiner

*Primary Examiner*—Tu-Tu V. Ho
(74) *Attorney, Agent, or Firm*—Wolf, Greenfield & Sacks, P.C.

(57) ABSTRACT

A memory element which stably performs operations such as data recording and which has a stable structure with respect to heat is provided.

A memory element 10 includes a memory layer 4 and an ion source layer 3 positioned between the first electrode 2 and second electrode 6, in which the ion source layer 3 contains any of elements selected from Cu, Ag and Zn, and any of elements selected from Te, S and Se, and the memory layer 4 is made of any of tantalum oxide, niobium oxide, aluminum oxide, hafnium oxide and zirconium oxide, or is made of mixed materials thereof.

4 Claims, 7 Drawing Sheets

MEMORY ELEMENT AND MEMORY DEVICE

CROSS REFERENCES TO RELATED APPLICATIONS

The present invention contains subject matter related to Japanese Patent Application JP 2004-361755 in the Japanese Patent Office on Dec. 14, 2004, the entire contents of which being incorporated herein by reference.

BACKGROUND OF THE INVENTION

1. Field of the Invention

The present invention relates to a memory element in which data can be recorded and a memory device including the memory element.

2. Description of the Related Art

In information devices such as a computer, a DRAM capable of high speed operation and having high density is used as a random access memory.

However, since the DRAM has a complicated manufacturing process compared with a typical logic circuit LSI and signal processing employed in an electronic apparatus, manufacture costs increase.

Further, since the DRAM is a volatile memory in which data disappears when the power is shut off, such refreshing operation that data written therein is frequently read out to be again amplified and rewritten is needed.

Then, as a nonvolatile memory element in which data does not disappear even if the power is shut off, FeRAM (Ferroelectric Random Access Memory), MRAM (Magnetic Random Access Memory) and the like are proposed, for example.

With such memory, written data can be retained for a long time without supplying the power.

Further, in case of those memories, a refreshing operation is unnecessary, because the memory is made nonvolatile, and it is assumed that the power consumption be reduced to that extent.

However, in the above-described nonvolatile memory, it becomes difficult to secure properties as a memory element due to a miniaturization of a memory element that constitutes each memory cell.

Therefore, it is difficult to miniaturize the element to the limit of a design rule and to the limit on a manufacturing process.

Hereupon, a memory element of a new type has been proposed as a memory having a suitable structure for miniaturization.

This memory element has a structure in which an ion conductor containing a certain metal is positioned between two electrodes.

Further, since the metal contained in the ion conductor is contained in one of the two electrodes, the metal contained in the electrode is diffused as an ion in the ion conductor when a voltage is applied between the two electrodes, and thereby an electric characteristic such as a resistance value or capacitance of the ion conductor changes.

A memory device can be made by using this characteristic (for example, refer to Patent reference 1 and Non-patent reference 1).

Specifically, the ion conductor is made of a solid solution of a chalcogenide and metal, further specifically, the ion conductor is made of a material in which Cu, Ag, and Zn are solidly solved into AsS, GeS, and GeSe, and one of the two electrodes contains Cu, Ag, and Zn (refer to the-above described Patent reference 1).

Furthermore, various kinds of nonvolatile memories using a crystal oxide material have also been proposed, and a memory in a device, for example, having a structure in which a Cr-doped $SrZrO_3$ crystal material is positioned between a lower electrode made of $SrRuO_3$ or Pt and an upper electrode made of Au or Pt is proposed, where a resistance is changed reversibly when applying a voltage of a different polarity (refer to the Non-patent reference 2). However, details of the principle and so on are not clear.

[Patent reference 1] Japanese Translation of PCT International Application No. 2002-536840

[Non-patent reference 1] Nikkei Electronics, Jan. 20, 2003 issue (page 104)

[Non-patent reference 2] A. Beck et al., Appl. Phys. Lett., 77, (year 2000), p. 139

SUMMARY OF THE INVENTION

However, as described above, the memory element having the structure in which Cu, Ag, and Zn are contained either in the upper electrode or in the lower electrode and the Ges or GeSe amorphous chalcogenide material is positioned between the electrodes and the memory element using the crystal oxide material have a considerable on-off ratio of a resistance, specifically, a ratio of a resistance value in a low resistance state (on-resistance) to a resistance value in a high resistance state (off-resistance) is extremely large, and the ratio has a value of four or more digits, for example.

Further, when a short voltage pulse is applied to such memory element whose on-off ratio of the resistance is considerably large, there is a case in which an intermediate value of those resistance values is obtained as the resistance value.

When the resistance value of the memory element becomes an intermediate value, there is a probability of decreasing in a margin for data identification at the time of readout.

It is assumed that the problem of the resistance value being an intermediate value is caused by the fact that the thickness of a thin film made of Ges, Gese and the like, in which resistance is changed, is comparatively thick (10 nm or more, for example) and so an electric field generated when a voltage is applied becomes comparatively weak, which causes atoms of Cu, Ag, Zn and the like that are to move as ions to be trapped on the way between certain positions instead of moving between certain positions. Furthermore, since the film thickness of a thin film in which resistance is changed is comparatively thick, a high speed operation of the memory element may not be obtained.

Further, since the intensity of the electric field when performing recording and erasure is not strong, it is assumed that an energy level of an ion atom to again start moving becomes low after the move (after the recording process or erasing process, the ionized state is transited to the non-ionized state), as a result, it becomes difficult to secure the characteristic of retaining data, which is necessary as a nonvolatile memory.

Accordingly, it is desirable in the above-described memory element that even if the film thickness is thin, a material having a sufficient insulation resistance be used as a memory thin film in which data is recorded by means of change in resistance.

Furthermore, in the state in which the memory thin film is low resistance, since a current having a comparatively large density flows and the temperature of the film becomes comparatively high due to Joule heat, it is desirable that a refractory material be used.

Hereupon, inventers of the present invention and others have proposed to use a rare-earth oxide thin film as a memory thin film in which data is recorded by means of the change in resistance.

When using a rare-earth oxide thin film as a memory thin film, sufficient resistance change is obtained even if the film thickness is thin, and so the above-described problem can be solved by means of an intense electric field with a thin film thickness.

As a material for the rare-earth oxide thin film, various kinds of rare-earth oxides can be used, and in consideration of material cost to be reduced, it is desirable that a broader range of materials including other elements than rare-earth oxides be used.

Particularly, in the case where the manufacturing process of a memory element is combined into a process of manufacturing a semiconductor, it is preferable that a material once used in the process of manufacturing a semiconductor or a material once studied to be applied to a semiconductor is used, for example.

The present invention addresses the above-identified and other problems, and provides a memory element which performs stable operations such as data recording and which has a stable structure against heat and a memory device including the memory element.

A memory element according to an embodiment of the present invention includes a memory layer and an ion source layer positioned between the first and second electrodes, in which the ion source layer contains any of elements selected from Cu, Ag and Zn, and any of elements selected from Te, S and Se, and the memory layer is made of any of tantalum oxide, niobium oxide, aluminum oxide, hafnium oxide and zirconium oxide, or is made of mixed materials thereof.

A memory device according to an embodiment of the present invention includes: a memory element having a memory layer and an ion source layer positioned between the first and second electrodes, in which the ion source layer contains any of elements selected from Cu, Ag and Zn, and any of elements selected from Te, S and Se, and the memory layer is made of any of tantalum oxide, niobium oxide, aluminum oxide, hafnium oxide and zirconium oxide, or is made of mixed materials thereof, wiring connected to the first electrode side and wiring connected to the second electrode side, wherein a number of memory elements are disposed.

According to the embodiment of the memory element of the present invention, since a memory layer and an ion source layer are positioned between the first and second electrodes and the ion source layer contains any of the elements selected from Cu, Ag and Zn, and any of the elements selected from Te, S and Se, data can be recorded using the change in resistance of the memory layer.

Specifically, when a positive electric potential, for example, is applied to the ion source layer containing Cu, Ag and Zn or to the side of an electrode in contact with the ion source layer and voltage is applied to the memory element, Cu, Ag and Zn (ion source elements) contained in the ion source layer are ionized and diffused in the memory layer and are combined with electrons and deposited at a portion on the side of the other electrode, or Cu, Ag and Zn remain in the memory layer to form an impurity level in an insulation film, so that the resistance value of the memory layer is lowered to the state of low resistance to enable the data recording to be performed.

Further, when in the above state a negative electric potential is applied to the ion source layer containing Cu, Ag and Zn or to one side of the electrode in contact with the ion source layer and voltage is applied to the memory element, Cu, Ag and Zn having been deposited on the other side of the electrode are again ionized and return to one side of the electrode, so that the resistance value of the memory layer returns to the state of high resistance and the resistance value of the memory element becomes high to enable the data erasure to be performed.

Further, since any of elements selected from Te, S and Se (chalcogenide elements) are contained in the ion source layer, ionization of Cu, Ag and Zn is facilitated.

Further, since the memory layer is made of any of tantalum oxide, niobium oxide, aluminum oxide, hafnium oxide and zirconium oxide, or is made of mixed materials thereof and those oxides are refractory, a microscopic structure of the memory layer can be stabilized against rise in temperature.

Accordingly, since the thermal resistance of the memory layer is improved, a yield ratio of manufacturing a memory element in a process under high temperature can be improved, stability is improved against rise in temperature locally occurred when performing recording, erasure and the like in the memory element to enable the number of repeated writing to increase, and further the state of high resistance can be maintained stably when data is retained in a high-temperature environment for a long period of time.

Further, since the memory layer made of the above-described oxide has a sufficient insulation resistance even when the film thickness is made thin, the state of high resistance can be obtained without difficulties and data can be recorded stably, because defects such as a pinhole are reduced.

According to the embodiment of the memory device of the present invention, since the memory device includes the above-described memory element according to an embodiment of the present invention, wiring connected to the first electrode side and wiring connected to the second electrode side, in which a number of the memory elements are disposed, data can be recorded and erased by applying electric current to the memory element through the wirings.

In the above-described memory element and memory device according to the embodiments of the present invention, the ion source layer may contain CuTe.

In such a structure, since Te has a high conductivity compared with other chalcogen elements and Cu also has a high conductivity, the resistance value of the ion source layer is lowered to make the difference in resistance value from that of the memory layer large. Accordingly, the change in resistance of the memory element due to recording and erasure of data is caused by the change in resistance of the memory layer having a high resistance value.

Accordingly, even in the case where the resistance value of the ion source layer including CuTe is changed due to rise in temperature, which has little effect on the change in the resistance value of the memory element, operation of a memory may not be affected considerably.

Consequently, deterioration of characteristics of the memory element can further be prevented, when the memory element is manufactured, used, and retained under a high-temperature environment.

According to the above-described embodiments of the present invention, since the state of high resistance can be maintained stably even if the memory element is used in a high-temperature environment or data is retained for a long period of time, data recorded in the memory layer is retained stably, and therefore reliability of the memory element can be enhanced.

Furthermore, since data is recorded using the change in the resistance value of the memory element, particularly using the change in the resistance value of the memory layer, data can be recorded and data can be retained without difficulties in the case where the memory element is miniaturized.

Consequently, according to the embodiments of the present invention, a memory device having high reliability can be obtained.

Moreover, a memory device can further be integrated (has higher density) and can be miniaturized.

DESCRIPTION OF THE PREFERRED EMBODIMENTS

First, prior to explanation of a specific embodiment of the present invention, the present invention will be briefly explained.

It is desirable in the above-described memory element that a sufficient insulation resistance be obtained in a thin film to be a recording layer (memory thin film) in which data is recorded by means of a change in resistance, though the film thickness is considerably thin, so that a state of high resistance is easily obtained and defects such as pinholes are reduced. Further, since an electric current of a comparatively large current density flows and Joule heat is generated in a state of low resistance (on-state) to make operation performed under the condition of high temperature, it is desirable that the thin film be made of a refractory material in light of stable operation under high temperature.

As a material to be a thin film having a sufficient insulation resistance and whose applicability to a semiconductor has been studied, an oxide film material for a gate insulation film of a MOS transistor and an oxide film for a capacitor of a DRAM are considered.

As an insulation film, an $SiO_2$ film is typically used, and other than that, in order to make a gate oxide film thin or in order to make a capacitance increase, various newly considered materials such as a hafnium oxide film, tantalum oxide film, or aluminum oxide film and the like have been studied.

Hereupon, as a memory layer of a memory element, any of tantalum oxide, niobium oxide, aluminum oxide, hafnium oxide and zirconium oxide, or a mixed material thereof is used in the present invention.

With such materials being used, a sufficient insulation resistance may be obtained when a considerably thin film is made, and since those oxides have comparatively high melting points, the memory element can be operated stably even in a high-temperature environment.

Further, as described above, having been used in a semiconductor process or having been studied to be used in a semiconductor process, those tantalum oxide, niobium oxide, aluminum oxide, hafnium oxide and zirconium oxide can be obtained comparatively easily at low costs.

Hereinafter, a specific embodiment of the present invention will be explained.

Figure 1:
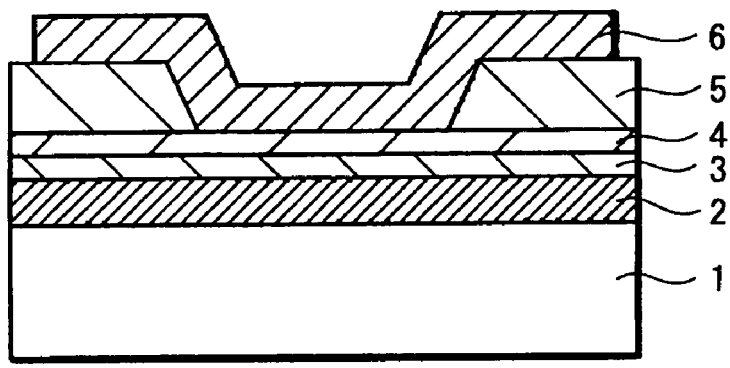
FIG. 1 is a schematic constitutional view (sectional view) of a memory element according to an embodiment of the present invention.

FIG. 1 shows a schematic constitutional view (sectional view) of a memory element according to an embodiment of the present invention.

A memory element 10 includes a substrate 1 having a high electric conductivity, for example, a silicon substrate 1 doped with high concentration P-type impurity ($P^{++}$), a lower electrode 2 formed thereon, an ion source layer 3 containing any of elements selected from Cu, Ag and Zn, and Te, S and Se formed thereon, a memory thin film (memory layer) 4 having a comparatively high resistance value formed thereon, and an upper electrode 6 formed to be connected to the memory thin film 4 through an opening made in an insulation layer 5 formed on the memory thin film 4.

Wiring materials used in a semiconductor process such as Tiw, Ti, W, Cu, Al, Mo, Ta, WN, TaN, silicide or the like can be used as the lower electrode 2.

In the case where a Tiw film is used as the lower electrode 2, the film thickness may be selected in the range of 10 nm to 100 nm.

Further, the ion source layer 3 may be formed of a film made of such as CuTe, GeSbTe, CuGeTe, AgGeTe, AgTe, ZnTe, ZnGeTe, CuS, CuGeS, CuSe, CuGeSe and the like containing at least any of Cu, Ag and Zn and at least any of chalcogenide elements of Te, S and Se, and further containing boron or rare-earth elements and silicon.

Particularly, in light of a sufficiently low resistance (lower than the resistance value of the memory thin film 4 being ON, for example) material compared with the memory thin film (memory layer) 4 having a comparatively high resistance which is only the portion where the resistance value is changed, it is desirable that Te be used as a chalcogenide element contained in the ion source layer 3 and the ion source layer 3 be formed of a material including CuTe, AgTe, ZnTe as a main component containing Cu, Ag and Zn that easily move as a positive ion.

When the ion source layer 3 includes CuTe using Cu as an element to be a positive ion, because resistance of the ion source layer 3 becomes low to make the change in resistance of the ion source layer 3 sufficiently low compared with the change in resistance of the memory thin film (memory layer) 4, the operation of the memory can be stabilized, which is further preferable.

In the case where a CuGeTe film is used as the ion source layer 3, the film thickness may be selected from 5 nm to 50 nm.

The insulation film 5 can be made of, for example, hard-cured photoresist; $SiO_2$ and $Si_3N_4$ typically used for a semiconductor device; and other materials such as an inorganic material, for example, SiON, SiOF, $Al_2O_3$, $Ta_2O_5$, $HfO_2$, $ZrO_2$, a fluorine-based organic material and an aromatic organic material.

Similarly to the lower electrode 2, a typical semiconductor wiring material is used for the upper electrode 6.

The memory element 10 according to an embodiment of the present invention includes the memory thin film (memory layer) 4 specifically made of any of tantalum oxide, niobium oxide, aluminum oxide, hafnium oxide and zirconium oxide or made of a mixed material thereof.

Since those oxides have a high melting point, a microscopic structure of the memory layer 4 can be stabilized against the rise in temperature.

Accordingly, since the thermal resistance of the memory thin film (memory layer) 4 is improved, a yield ratio of manufacturing the memory element 10 in a process under high temperature can be improved.

Further, stability is improved with respect to rise in temperature locally occurred when performing recording, erasure and the like in the memory element 10, which enables the number of repeated writing to increase.

Further, the state of high resistance can be maintained stably when data is retained in a high-temperature environment for a long period of time.

Further, the memory thin film (memory layer) 4 made of the above-described oxide has a sufficient insulation resistance even when the film thickness is made thin.

Accordingly, since the state of high resistance is obtained without difficulties and defects such as a pinhole are reduced, data can be recorded stably.

In the memory element 10 according to an embodiment of the present invention, data can be stored by the operation as follows.

First, a positive electric potential (+ potential), for example, is applied to the ion source layer 3 containing Cu, Ag and Zn and a positive voltage is applied to the memory element 10 such that the side of the upper electrode 6 becomes negative. With this, Cu, Ag and Zn are ionized from the ion source layer 3 to diffuse in the memory thin film 4 and are combined with electrons on the side of the upper electrode 6 to be deposited, or to remain in the memory thin film 4 in a diffused state.

Then, since a current path containing a large amount of Cu, Ag, and Zn is formed in the memory thin film 4 or a large number of defects caused by Cu, Ag, and Zn are formed in the memory thin film 4, the resistance value of the memory thin film 4 becomes low. Since a resistance value of each layer other than the memory thin film 4 is originally low in comparison with the resistance value of the memory thin film 4 before recording, the resistance value of the whole memory element 10 can also be lowered by lowering the resistance value of the memory thin film 4.

After that, when the positive voltage is removed to make the voltage applied to the memory element 10 eliminated, the memory element 10 is kept in a state where the resistance value is lowered. Hence, data can be recorded. When the memory element is used in a memory device capable of recording only once, that is, PROM, the recording is finished only with the recording process as described above.

On the other hand, on application to a memory device capable of erasing data, specifically, on application to a RAM, EEPROM or the like, an erasing process is needed, in which a negative potential (− potential), for example, is applied to the ion source layer 3 containing Cu, Ag and Zn and a negative voltage is applied to the memory element 10 such that the side of the upper electrode 6 becomes positive. With this, Cu, Ag, and Zn constituting the current path or impurity level formed in the memory thin film 4 are ionized and move in the memory thin film 4 to return to the side of the ion source layer 3.

Then, the current path or defects caused by Cu, Ag, and Zn disappear in the memory thin film 4, and the resistance value of the memory thin film 4 becomes high. Since the resistance value of each layer other than the memory layer 4 is originally low, the resistance value of the whole memory element 10 can also be raised by making the resistance value of the memory thin film 4 high.

After that, when the negative voltage is removed and the voltage applied to the memory element 10 is eliminated, the memory element 10 can be kept in a state where the resistance value is raised. Accordingly, it becomes possible to erase the recorded data.

By repeating such process, data recording (writing) and erasure of recorded data can be performed repeatedly in the memory element 10.

Further, since the ion source layer 3 particularly contains elements selected from Te, S and Se, that is, chalcogen elements in addition to the above-described metal elements (Cu, Ag and Zn), the metal elements (Cu, Ag and Zn) and the chalcogen elements (Te, S and Se) in the ion source layer 3 are combined to make a metal chalcogenide layer. The metal chalcogenide layer mainly has an amorphous structure, and when a positive potential, for example, is applied to the side of the lower electrode 2 in contact with the ion source layer 3 made of the metal chalcogenide layer, the metal elements (Cu, Ag and Zn) contained in the metal chalcogenide layer are ionized to be diffused in the memory thin film 4 of high resistance and are combined with electrons at a portion on the side of the upper electrode 6 to be deposited or to remain in the memory thin film 4 forming an impurity level of an insulation layer, thereby making resistance of the memory thin film 4 low to perform data recoding.

Subsequently, when a negative potential is applied to the side of the lower electrode 2 in contact with the ion source layer 3 made of the metal chalcogenide layer, the metal elements (Cu, Ag, and Zn) that have been deposited on the side of the upper electrode 6 are again ionized and return to the metal chalcogenide layer, and so the resistance of the memory thin film 4 returns to the state of original high resistance and the resistance of the memory element 10 also becomes high, thereby performing the erasure of recorded data.

Further, when the state of high resistance value is made to correspond to information of "0" and the state of low resistance value is made to correspond to information of "1", respectively, for example, it is possible to change from "0" to "1" in the data recording process by applying the positive voltage and to change from "1" to "0" in the data erasing process by applying the negative voltage.

Note that typically the memory thin film 4 has high resistance in the initial state before recording, however, may have low resistance of the recorded state in the initial state by means of a plasma treatment, annealing treatment, and the like in the process.

The resistance value after the recording is dependent on recording conditions such as the width of the voltage pulse or of the current pulse which are applied at the time of recording and the amount of current rather than the cell size and the material composition of the memory thin film 4 of a memory element 10, and the resistance value after the recording is in the approximate range of 50 Ω to 50 kΩ in the case where the initial resistance value is 100 kΩ or more.

In order to demodulate the recorded data, the ratio of the resistance value in the initial state to the resistance value after the recording only needs to be approximately twofold or more such that a resistance value before recording is 100 Ω and a resistance value after the recording is 50 Ω, or a resistance value before recording is 100 kΩ and a resistance value after recording is 50 kΩ, and the initial resistance value of the memory thin film 4 is selected to satisfy such conditions. The resistance value of the memory thin film 4 can be determined by adjusting the oxygen concentration, film thickness, area of the memory thin film 4 and by adding an impurity material, for example.

According to the structure of the above-described memory element 10 of this embodiment, since the ion source layer 3 and memory thin film 4 are positioned between the lower electrode 2 and upper electrode 6, a current path containing a large amount of Cu, Ag and Zn is formed in the memory thin film 4 or a large number of defects are formed in the memory thin film 4 in the case where a positive voltage (+ potential), for example, is applied to the side of the ion source layer 3 to make the side of the upper electrode 6 negative, so that the resistance value of the memory thin film 4 becomes low and therefore the resistance value of the whole memory element 10 becomes low. Then, when the application of the positive voltage is stopped and no voltage is applied to the memory element 10, the state of low resistance is retained to be capable of recording data. This kind of structure is used in a memory device of PROM or the like in which the recording can be performed only once.

Further, data is recorded using the change in a resistance value of the memory element 10, particularly using the change in a resistance value of the memory thin film 4, and so the recording of data and retention of recorded data can be performed without difficulties in the case where the memory element is further miniaturized.

Further, when using the above memory element in a memory device of, for example, RAM, EEPROM or the like in which erasure of data can be performed in addition to recording, a negative voltage (− potential), for example, is applied to the ion source layer 3 in the above-described memory element 10 in the state after the recording to make the side of the upper electrode side 6 positive. With this, the current pass made of Cu, Ag and Zn or defects formed in the memory thin film 4 disappear to make the resistance value of the memory thin film 4 high and the resistance value of the whole memory element 10 becomes high. Then, with the application of the negative voltage being stopped and no voltage being applied to the memory element 10, the state of high resistance value is retained and the recorded data can be erased.

Further, according to the memory element 10 of this embodiment, since the memory thin film (memory layer) 4 is made of any of tantalum oxide, niobium oxide, aluminum oxide, hafnium oxide and zirconium oxide, or a mixed material thereof and those oxides are refractory, the microscopic structure of the memory layer 4 can be stabilized with respect to rise in temperature.

Accordingly, since the thermal resistance of the memory thin film (memory layer) 4 is improved, a yield ratio of manufacturing a memory element 10 in a process under high temperature can be improved, stability is improved with respect to rise in temperature locally occurred when performing recording, erasure and the like in the memory element 10 to enable, for example, the number of repeated writing to increase, and further the state of high resistance can be maintained stably when data is retained in a high-temperature environment for a long period of time.

Further, since the memory thin film (memory layer) 4 made of the above-described oxide has a sufficient insulation resistance even if the film thickness is made thin, the state of high resistance can be obtained without difficulties and defects such as a pinhole can be reduced, which enables data to be recorded stably.

Further, according to the memory element 10 of this embodiment, each of the lower electrode 2, ion source layer 3, memory thin film 4 and upper electrode 6 can be made of a material capable of being sputtered. For example, using a target which has a composition applicable as a material to each layer, sputtering can be performed.

Further, by exchanging a target in the same sputtering apparatus, layers can be formed successively.

Note that in the memory element 10 of the above-described embodiment, an oxide thin film constituting the memory thin film 4 can be formed by a method using an oxide sputtering target, a method using a metal target and introducing oxygen as well as inert gas, for example, argon as introduction gas in sputtering, that is, a reactive sputtering method or the like.

Furthermore, an oxide thin film can also be formed by a CVD method, deposition method or the like other than sputtering, and further an oxide thin film can be formed by using a material that is in the metal state when forming a film and thereafter becomes an oxide thin film by means of thermal oxidation, chemical treatment or the like.

The memory element 1 of FIG. 1 can be manufactured, for example, as follows.

First, on the substrate 1 having a high electric conductivity, for example, a silicon substrate in which high concentration P-type impurity is doped, the lower electrode 2, for example, a tantalum (Ta) film is deposited.

Next, the ion source layer 3, for example, a CuTeGe film is formed, and after that, the memory thin film 4, for example, a tantalum oxide film is formed.

After that, the insulation layer 5 is formed to cover the memory thin film 4, and a part of the insulation layer 5 is removed by photolithography to form a contact portion to the memory thin film 4.

Subsequently, as the upper electrode 6, for example, a tungsten (W) film is formed using a magnetron sputtering apparatus, for example.

After that, patterning is performed on the W film by plasma etching or the like. Other etching methods than the plasma etching, such as ion milling, RIE (Reactive Ion Etching) or the like can also be used for patterning.

As described above, the memory element 10 shown in FIG. 1 can be manufactured.

A memory device can be formed by using a number of above-described memory elements 10 of this embodiment to be disposed in column shape or matrix shape.

Wiring connected to the side of the lower electrode 2 and wiring connected to the side of the upper electrode 6 are provided with respect to each of the memory elements 10, and each memory element 10 may be disposed in the vicinity of an intersection of those wirings, for example.

Specifically, the lower electrode 2 is formed to be common to memory cells in the row direction and the wiring connected to the upper electrode 6 is formed to be common to memory cells in the column direction, for example, and a memory cell where recording should be performed is determined by selecting the lower electrode 2 and wiring in which an electric potential is applied to make a current flow; and then a current is made to flow in the memory element 10 in the memory cell to perform recording of data and erasure of the recorded data.

Further, according to the memory element 10 of the above-described embodiment, data recording and data erasure can be performed easily and stably, and particularly the memory element has an advantage in stability when retaining data under a high-temperature environment for a long period of time.

Further, the recording of data and retention of the recorded data can be performed easily, in the case where the above-described memory element 10 of this embodiment becomes miniaturized.

Accordingly, when the above-described memory element 10 of this embodiment is used to form a memory device, integration (high density) and miniaturization of the memory device can be facilitated.

[Practice Example]

Next, the above-described memory element 10 of this embodiment was manufactured practically and the characteristic thereof was studied.

[Experiment 1]

On a silicon wafer, a tantalum (Ta) film of 20 nm in thickness was deposited as the lower electrode 2, a $Cu_{50}Te_{35}Ge_{15}$ film of 20 nm in thickness was formed thereon as the ion source layer 3, an oxide tantalum film was formed as the memory thin film 4 and photoresist was formed to cover the surface, and after that, exposure and development were performed by means of photolithography to form an opening (through hole) in the photoresist on the memory thin film 4. Among those layers, the oxide tantalum film was formed such that after a tantalum film in the metal state was formed in the thickness of 1 nm by sputtering, oxidation treatment was performed in oxygen contained plasma atmosphere. It is assumed that the oxide tantalum film became somewhat thicker than the original tantalum film by the above oxidation treatment.

Subsequently, annealing treatment was performed in a vacuum and the photoresist was transformed to be the insulation layer 5 as hard-cured resist which is stable with respect to temperature, etching and the like. It should be noted that hard-cured resist was used as the insulation layer 5 because of convenience to be formed in simple and easy manner in the experiment, and when manufacturing commercial products, it is preferable that other materials (such as silicon oxide film) is used as the insulation layer 5.

Next, as the upper electrode 6, a tantalum (Ta) film of 100 nm in thickness was formed. After that, by means of photolithography using a plasma etching apparatus, patterning was performed on the upper electrode 6 deposited on the insulation layer 5 made of hard-cured resist.

The memory element 10 having such a structure was manufactured to be a sample 1.

Further, a sample 2 of the memory element 10 was made similarly to the sample 1 except that the thickness of the tantalum film to be the oxide tantalum film of the memory thin film 4 was 3 nm.

Further, a sample 3 of the memory element 10 was made similarly to the sample 1 except that the thickness of the tantalum film to be the oxide tantalum film of the memory thin film 4 was 5 nm.

Note that, with respect to the sample 3 in which the tantalum film had the thickness of 5 nm, oxidation treatment was not effected on the entire tantalum film, and the memory thin film 4 was made of a tantalum oxide film, part of which lacked oxygen.

I-V characteristic was measured with respect to each of the samples 1 to 3.

I-V measurement was performed as follows.

With respect to the memory element of each sample, the rear surface of the low resistance silicon substrate 1 conducted to the lower electrode 2 was connected to the ground potential and a negative potential (− potential) was applied to the upper electrode 6.

Then, the negative potential applied to the upper electrode 6 was reduced from 0V and the change in the current was measured.

However, settings had been made that a current limiter would operate when the current reached 1mA and the negative potential applied to the upper electrode 6, that is, the absolute value of the voltage applied to the memory element was prevented from increasing further more.

Further, from the state in which the current reached 1 ma and the current limiter was operated, the negative voltage applied to the upper electrode 6 was reduced to 0V and the change in the current was measured. Subsequently, at this time, a positive potential was applied to the upper electrode on the contrary, and after the positive voltage was made to increase until the current decreased not to flow, the potential was returned to 0 potential.

Figure 2A:
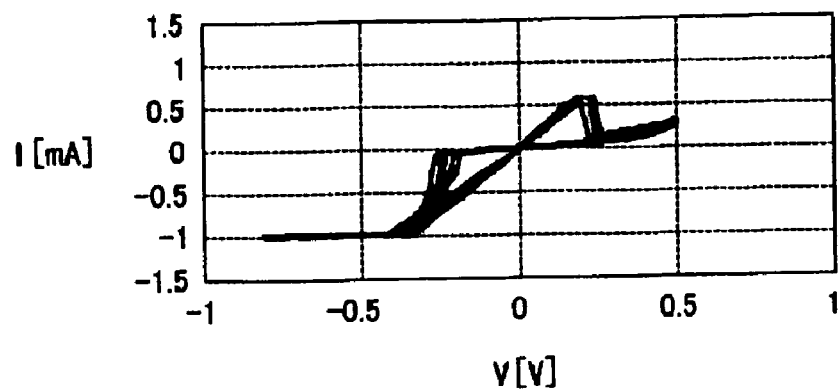
FIG. 2A is a measurement result of a I-V characteristic of a memory element of a sample 1.
Figure 2B:
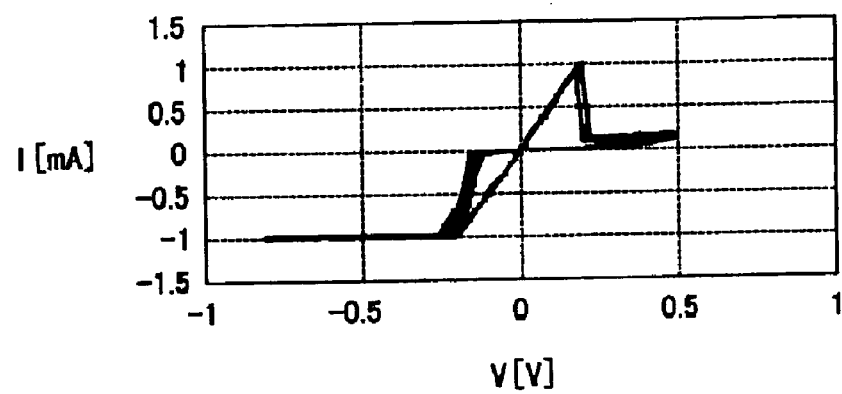
FIG. 2B is a measurement result of a I-V characteristic of a memory element of a sample 2.
Figure 2C:
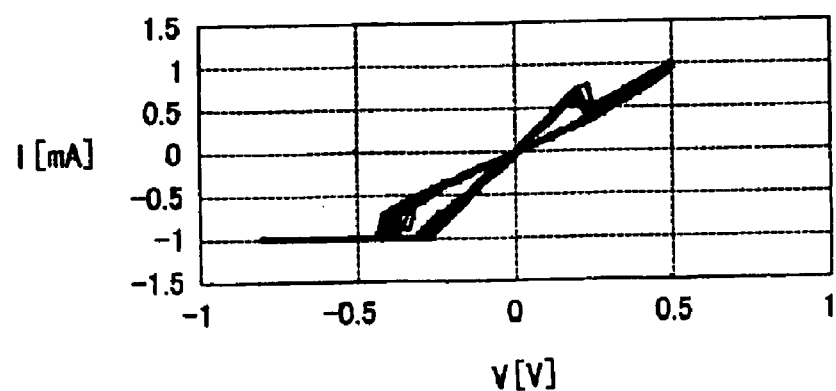
FIG. 2C is a measurement result of a memory element of a I-V characteristic of a sample 3.

FIGS. 2A to 2C show measurement results of the I-V characteristic obtained as described above. FIG. 2A shows a measurement result of the sample 1, FIG. 2B shows a measurement result of the sample 2, and FIG. 2C shows a measurement result of the sample 3.

It is confirmed from FIGS. 2A to 2C that repeated recording and erasing operations were performed reliably in each of the samples even when a considerably large recording current of 1 1mA was applied.

[Experiment 2]

Figure 3:
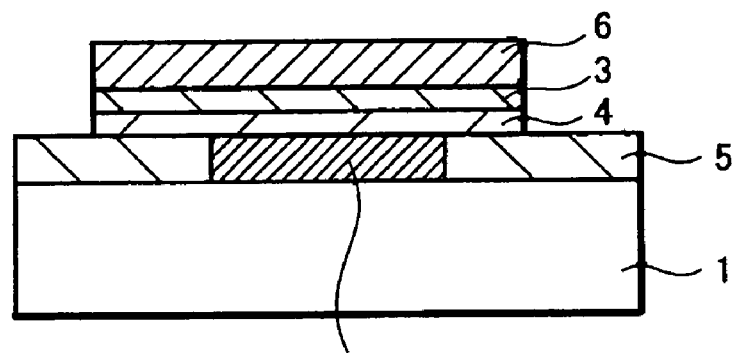
FIG. 3 is a schematic constitutional view (sectional view) of a memory element according to another embodiment of the present invention.

Instead of the memory element 10 shown in FIG. 1, a memory element 20 shown in FIG. 3 was manufactured as another embodiment of the present invention and the characteristic thereof was studied.

In the memory element 20 shown in FIG. 3, the memory thin film (memory layer) 4 was formed below the ion source layer 3, on the contrary to the memory element 10 shown in FIG. 1 according to the previous embodiment. Further, the upper electrode 6 was made of the same pattern as the memory thin film 4 and ion source layer 3. The lower electrode 2 was made of a smaller pattern and was buried in an opening formed in the insulation film 5.

Similarly to the memory element 10 according to the previous embodiment, since the memory thin film 4 (memory layer) 4 in the memory element 20 shown in FIG. 3 is made of the above-described oxide film, the thermal resistance of the memory thin film (memory layer) 4 is improved, a yield ratio of manufacturing the memory element 20 in a process under high temperature can be improved, and stability is improved with respect to rise in temperature locally occurred when performing recording, erasure and the like in the memory element 20, so that the number of repeated writing can increase and further the state of high resistance can be maintained stably when data is retained in a high-temperature environment for a long period of time.

The memory element 20 having the above structure can be manufactured as follows.

On the silicon substrate 1 having low resistivity, the insulation film ($Al_2O_3$ or $Ta_2O_5$, for example) 5 was uniformly deposited by sputtering, after that, the lower electrode pattern was formed with photoresist by photolithography (the patterned portion having no resist), and subsequently the insulation film 5 was partly removed by RIE (Reactive Ion Etching).

Next, a material constituting the lower electrode 2 (tungsten (w), for example) was uniformly deposited by sputtering. Then, treatment by means of CMP (Chemical Mechanical Polishing) was performed on the surface to be planarized and the low electrode material was made to remain only in the low electrode pattern. Hence, the lower electrode 2 was formed with a predetermined pattern.

Next, layer of the memory thin film (memory layer) 4, ion source layer 3 and upper electrode 6 were successively formed by sputtering.

Then, patterning was performed on those films 4, 3, and 6 by photolithography and etching treatment, and the memory element 20 having the structure shown in FIG. 3 was manufactured.

When comparing the memory element 20 shown in FIG. 3 with the memory element 10 shown in FIG. 1, since the positional relationship in the vertical direction between the ion source layer 3 and memory thin film 4 was reverse and the order of formation was different, the characteristic of the memory would be different in the memory thin film 4 whose film thickness was particularly thin due to the difference in the state of a base film. In the memory element 10 shown in FIG. 1, the base film immediately beneath the memory thin film 4 was the ion source layer 3, and on the contrary in the memory element 20 shown in FIG. 3, the base film immediately beneath the memory thin film 4 was the lower electrode 2 and insulation film 5.

Then using the above-described manufacturing method, the memory element 20 shown in FIG. 3 was manufactured to be a sample 4 in which the tungsten (W) film having the thickness of 200 nm was deposited as the lower electrode 2 on the silicon wafer, an oxide hafnium film having the thickness of 2 nm was formed thereon as the memory thin film 4, a $Cu_{50}Te_{31}Ge_{13}Hf_6$ film having the thickness of 20 nm was formed as the ion source layer 3, and a tungsten (W) film having the thickness of 200 nm was formed as the upper electrode 5. Hereupon, an oxide silicon film was formed as the insulation layer 5 and the dimension of the pattern to be the lower electrode was approximately 1 μmφ.

Further, similarly to the sample 4 except that the film thickness of the oxide hafnium film constituting the memory thin film 4 was 4 nm, the memory element 20 was manufactured to be a sample 5.

An oxide tantalum film was formed as the insulation film 5, an oxide niobium film of 2 nm in thickness was formed as the memory thin film 4, a $Cu_{50}Te_{31}Gel_3Hf_6$ film was formed as the ion source layer 3, and other structure than those was similar to the sample 4 to obtain a sample 6.

Further, similarly to the sample 6 except that the thickness of the oxide niobium film was 4 nm, the memory element 20 was manufactured to be a sample 7.

An oxide zirconium film having the thickness of 2.4 nm was formed as the memory thin film 4, a $Cu_{50}Te_{31}Ge_{13}Hf_6$ film was formed as the ion source layer 3, and other structure than those was similar to the sample 6 to manufacture memory element 20 to be a sample 8.

Further, similarly to the sample 8 except that the thickness of the oxide zirconium film of the memory thin film 4 was 4.8 nm, the memory element 20 was manufactured to be a sample 9.

An oxide aluminum film having the thickness of 1.2 nm was formed as the memory thin film 4, a $Cu_{52}Te_{33}Ge_{15}$ film was formed as the ion source layer 3, and the other structure than those was similar to the sample 6 to manufacture the memory element 20 to be a sample 10.

Further, similarly to the sample 10 except that the thickness of the oxide aluminum film of the memory thin film 4 was 2.4 nm, the memory element 20 was manufactured to be a sample 11.

Further, similarly to the sample 10 except that the thickness of the oxide aluminum film of the memory thin film 4 was 3.6 nm, the memory element 20 was manufactured to be a sample 12.

In those samples 4 to 12, since the surface state of each of the lower electrodes 2 was controlled particularly by treatment using a CMP method, the surface roughness Ra of the surface of each sample was made small to be 0.8 nm or less, when observing with AFM (Atomic Force Microscope).

As described above, since the surface roughness Ra of the lower electrode 2 can be made small, a favorable memory characteristic can be obtained.

Figure 4A:
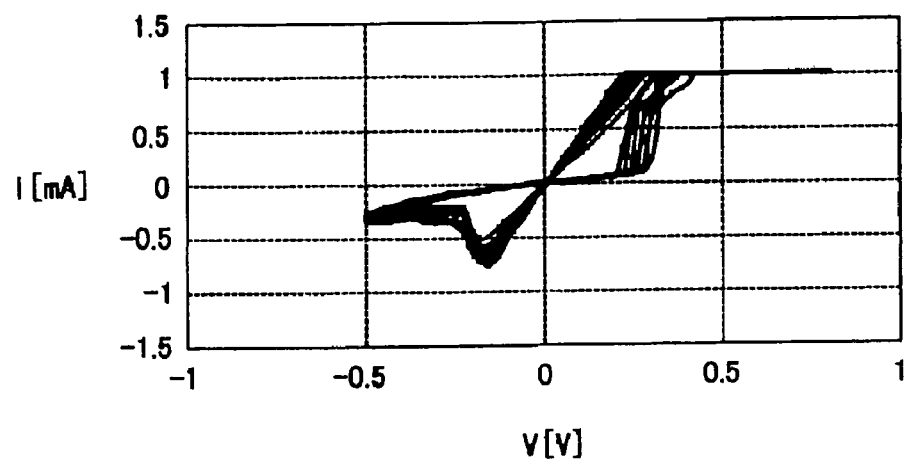
FIG. 4A is a measurement result of a I-V characteristic of a memory element of a sample 4.
Figure 4B:
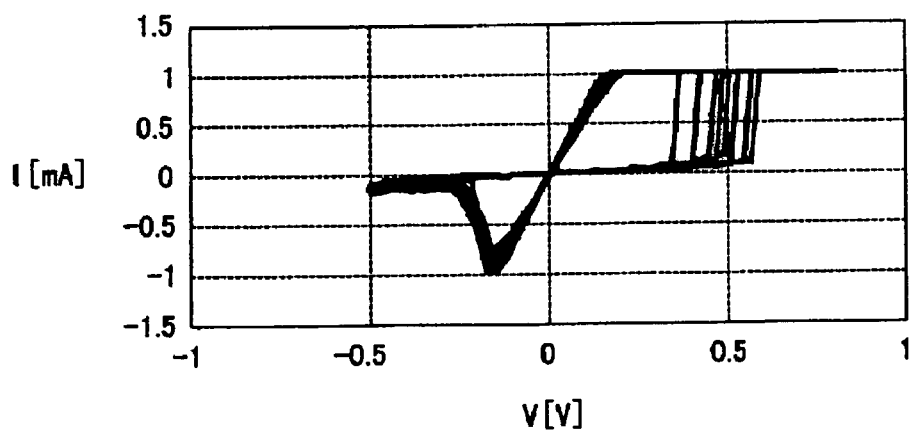
FIG. 4B is a measurement result of a I-V characteristic of a memory element of a sample 5.
Figure 5A:
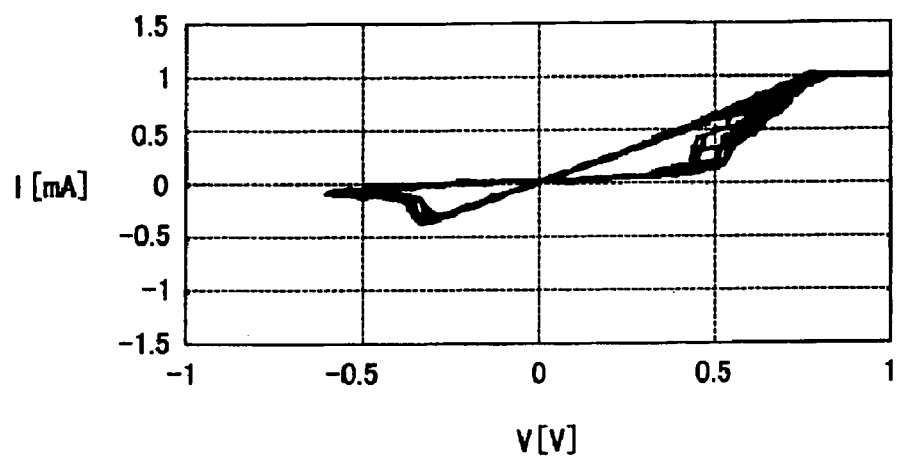
FIG. 5A is a measurement result of a I-V characteristic of a memory element of a sample 6.
Figure 5B:
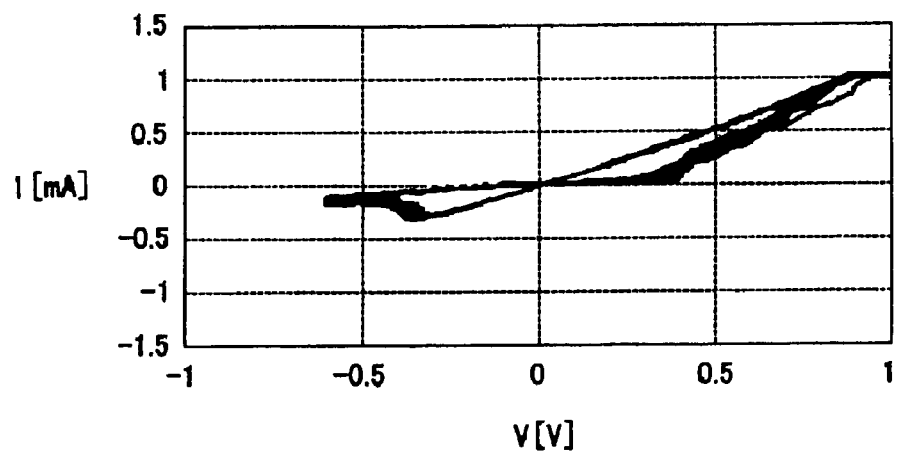
FIG. 5B is a measurement result of a I-V characteristic of a memory element of a sample 7.
Figure 6A:
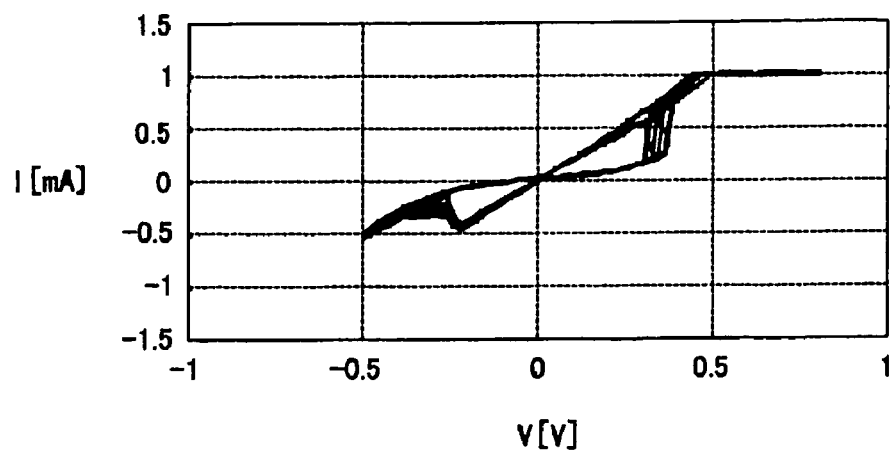
FIG. 6A is a measurement result of a I-V characteristic of a memory element of a sample 8.
Figure 6B:
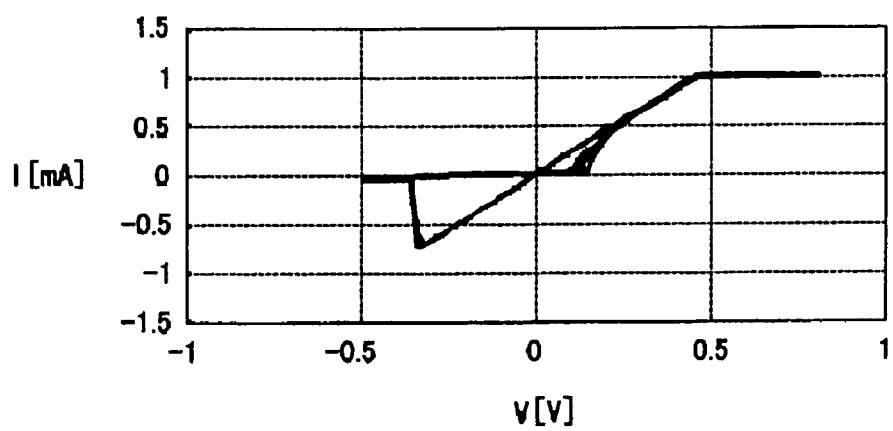
FIG. 6B is a measurement result of a I-V characteristic of a memory element of sample 9.
Figure 7A:
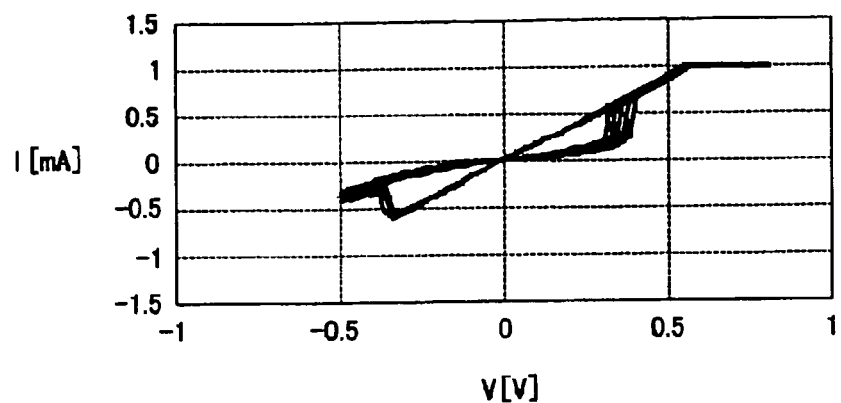
FIG. 7A is a measurement result of a I-V characteristic of a memory element of sample 10.
Figure 7B:
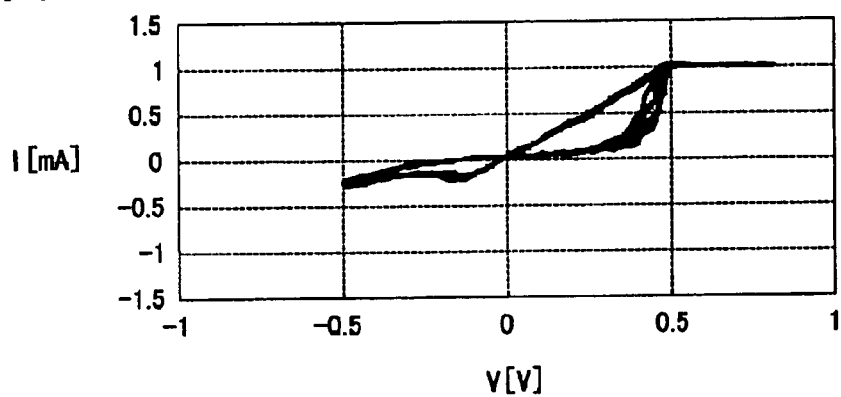
FIG. 7B is a measurement result of a memory element of a sample 11.
Figure 7C:
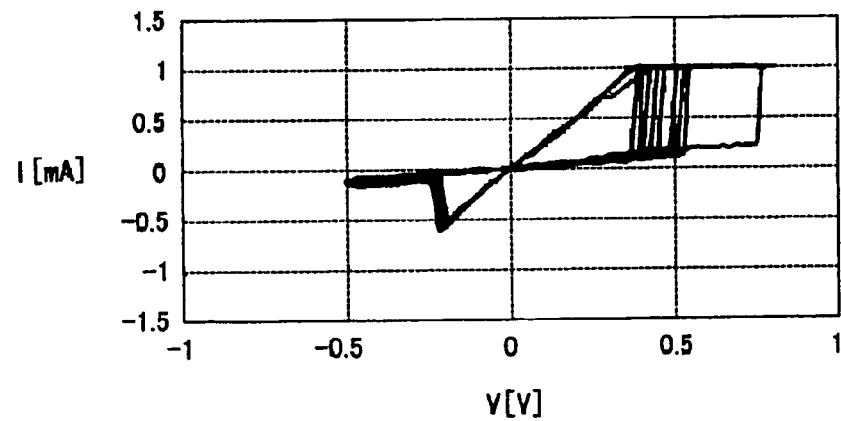
FIG. 7C is a measurement result of a I-V characteristic of a memory element of a sample 12.

Further, each I-V characteristic of the samples 4 to 12 of the memory element 20 was measured. FIGS. 4A through 7C show the measurement results of the I-V characteristic. FIG. 4A shows a measurement result of the sample 4 and FIG. 4B shows a measurement result of the sample 5. FIG. 5A shows a measurement result of the sample 6 and FIG. 5B shows a measurement result of the sample 7. FIG. 6A shows a measurement result of the sample 8 and FIG. 6B shows a measurement result of the sample 9. FIG. 7A shows a measurement result of the sample 10, FIG. 7B shows a measurement result of the sample 11 and FIG. 7C shows a measurement result of the sample 12.

Repeated memory operations were stably operated in each of the samples with respect to a considerably large amount of current 1 mA.

In each of the memory thin films 4 used in the samples 1 to 12, oxide tantalum has the melting point of 1880° C., oxide hafnium has that of 2770° C., oxide niobium has that of 1900° C., oxide zirconium has that of 2680° C., and oxide aluminum has that of 2050° C., which are all high. In other words, since each material has an excellent thermostability, a stable memory operation can be obtained even when a large current is locally applied.

Accordingly, when using those refractory oxide films as the memory thin film (memory layer) 4, a memory element having stability with respect to heat (repeated writing durability, for example) can be obtained.

[Experiment 3]

[Repeated Recording and Erasure Experiments]

Figure 8:
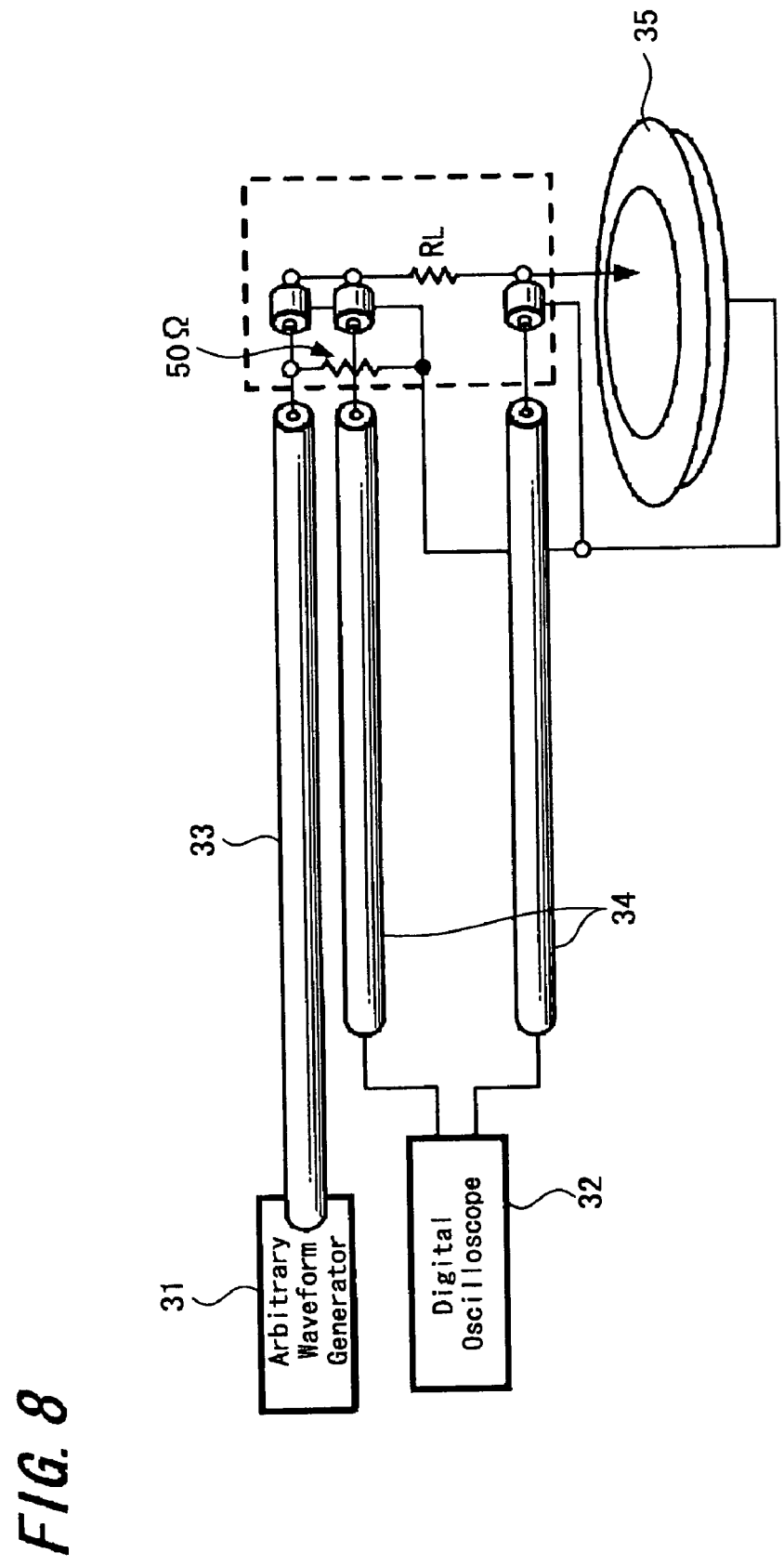
FIG. 8 is a view showing a schematic construction of a measuring apparatus used in experiments on repeated recording and erasure.

Next, a measuring apparatus was constructed as shown in FIG. 8 with respect to a sample of the memory element 20 similar to the one used in the experiment 2, and the recording and erasure experiments were repeatedly performed.

The measuring apparatus shown in FIG. 8 includes an arbitrary waveform generator 31 and a digital oscilloscope 32.

The arbitrary waveform generator 31 was connected to the load resistance enclosed by a broken line through a pulse applying line 33. Further, the digital oscilloscope 32 was connected to the load resistance through two voltage monitor lines 34. The load resistance had two lines of the resistance value 50 Ω and of the resistance value $R_L$ (2 kΩ).

Further, wiring was connected from the load resistance to the substrate of the wafer 35 (rear surface side) and to the upper electrode side, respectively.

Using the above-described measuring apparatus, a recording process was performed such that a recording pulse (about 1V) having the pulse width of 1 ms was applied from the arbitrary waveform generator 31 through the pulse applying line 33 to record data in the memory element 20 in the wafer 35, and thereafter, the recorded data was read with 1 ms. Further, a erasing process was similarly performed such that an erasing pulse (about 1V) having the pulse width of 1 ms was applied from the arbitrary waveform generator 31 through the pulse applying line 33 to erase the data recorded in the memory element 20 in the wafer 35 and thereafter, the result was read with 1 ms. Then, the recording process and erasing process were repeatedly performed, and the change in the state was observed by the digital oscilloscope 32. A resistance value of the memory element 20 was obtained from the state obtained with the digital oscilloscope 32.

Recording and erasure were performed repeatedly and when the resistance value after an erasing process (high resistance state) was gradually lowered to be twice the resistance value after a recording process (low resistance state), the number of times of both the operations until then was defined as the number of repetition.

Four kinds of samples were used in this experiment, that is, the sample 5 in which oxide hafnium was used for the memory thin film 4, the sample 7 in which oxide niobium was used for the memory thin film 4, the sample 9 in which oxide zirconium was used for the memory thin film 4 and the sample 12 in which oxide aluminum was used for the memory thin film 4.

Regarding each of the samples, the same measurement was performed three times consecutively.

Table 1 shows the measurement values at the repeated numbers together with the film thickness and melting point of an oxide film constituting the memory thin film 4 and the atomic radius of a metal element constituting the oxide. The atomic radius of each metal element is as follows: Hf of oxide hafnium is 0.155 nm, Nb of oxide niobium is 0.145 nm, Zr of oxide zirconium is 0.155 nm and Al of oxide aluminum is 0.125 nm.

TABLE 1

|  | Film Thickness | Number of Repetition | Melting Point | Atomic Radius |
|---|---|---|---|---|
| Oxide Hafnium | 4 nm | >$10^6$<br>>$10^6$<br>>$10^6$ | 2770° C. | 0.155 nm |
| Oxide Niobium | 4 nm | >$10^6$<br>60000<br>7500 | 1900° C. | 0.145 nm |
| Oxide Zirconium | 4.8 nm | >$10^6$<br>>$10^6$<br>>$10^6$ | 2680° C. | 0.155 nm |
| Oxide Aluminum | 3.6 nm | 10000<br>10000<br>5000 | 2050° C. | 0.125 nm |

As shown in Table 1, degradation was observed in oxide aluminum and oxide niobium, however, no degradation was observed in oxide hafnium and oxide zirconium after repeating the operation $10^6$ (one million times).

The reason for the resistance value gradually lowering after the erasing process is assumed that insulation performance of an oxide film constituting the memory thin film 4 is damaged by Joule heat caused by a current flowing when recording and erasure are repeatedly performed and by a repeated movement of an ion source element (Cu element in samples of this time).

A high melting point of the oxide film can prevent the degradation due to Joule heat and a large atomic size is efficient with respect to the movement of the ion source element.

Table 1 shows that in actuality the number of repetition was large with respect to oxide hafnium and oxide zirconium each having a high melting point and a large atomic radius.

Accordingly, the number of repetition can be made large by selecting oxide constituting a memory thin film (memory layer) that has preferably a melting point of 180°° C. or more, further preferably 2100° C. or more.

Further, the number of repetition can be made large by making a metal element constituting an oxide thin film in a memory thin film (memory layer) have further preferably the atomic radius of 0.15 nm or more.

It should be understood by those skilled in the art that various modifications, combinations, sub-combinations and alterations may occur depending on design requirements and other factors insofar as they are within the scope of the appended claims or the equivalents thereof.

What is claimed is:

1. A memory element comprising:
   a memory layer and an ion source layer positioned between first and second electrodes,
   wherein said ion source layer contains any of elements selected from Cu, Ag and Zn, and any of elements selected from Te, S and Se, and
   said memory layer is made of any of tantalum oxide, niobium oxide, aluminum oxide, hafnium oxide and zirconium oxide, or is made of mixed materials thereof.

2. The memory element according to claim 1, wherein said ion source layer contains CuTe.

3. A memory device comprising:
   a memory element including a memory layer and an ion source layer positioned between first and second electrodes, in which said ion source layer contains any of elements selected from Cu, Ag and Zn, and any of elements selected from Te, S and Se, and said memory layer is made of any of tantalum oxide, niobium oxide, aluminum oxide, hafnium oxide and zirconium oxide, or is made of mixed materials thereof,
   wiring connected to a first electrode side and
   wiring connected to a second electrode side,
   wherein a number of memory elements are disposed.

4. The memory device according to claim 3, wherein said ion source layer contains CuTe.

* * * * *